United States Patent [19]
Soga et al.

[11] Patent Number: 6,090,718
[45] Date of Patent: Jul. 18, 2000

[54] DRY ETCHING METHOD FOR SEMICONDUCTOR SUBSTRATE

[75] Inventors: Hajime Soga, Toyota; Kenji Kondo, Hoi-gun; Eiji Ishikawa, Nukata-gun; Yoshikazu Sakano, Obu; Yuji Ichikawa, Okazaki, all of Japan

[73] Assignee: Denso Corporation, Kariya, Japan

[21] Appl. No.: 08/992,108

[22] Filed: Dec. 17, 1997

[30] Foreign Application Priority Data

Dec. 17, 1996 [JP] Japan .................................. 8-354070
Sep. 5, 1997 [JP] Japan .................................. 9-257492

[51] Int. Cl.[7] .............................................. H01H 21/302
[52] U.S. Cl. ........................... 438/714; 134/1.1; 134/1.2; 134/1.3; 438/723; 438/905; 438/906
[58] Field of Search .................... 134/1.1, 1.2, 1.3; 438/714, 723, 905, 906

[56] References Cited

U.S. PATENT DOCUMENTS

| | | | |
|---|---|---|---|
| 5,221,425 | 6/1993 | Blanchard et al. | 216/66 |
| 5,423,941 | 6/1995 | Komura et al. | 438/700 |
| 5,522,966 | 6/1996 | Komura et al. | 438/701 |
| 5,647,953 | 7/1997 | Williams et al. | 134/1.1 |
| 5,728,602 | 3/1998 | Bellows et al. | 438/14 |
| 5,746,928 | 5/1998 | Yen et al. | 134/1.1 |
| 5,810,937 | 9/1998 | Gupta et al. | 134/1.1 |

FOREIGN PATENT DOCUMENTS

| | | |
|---|---|---|
| 60-113428 | 6/1985 | Japan . |
| 3-170678 | 7/1991 | Japan . |
| 5-074739 | 3/1993 | Japan . |
| 6-084851 | 3/1994 | Japan . |
| 7-201814 | 8/1995 | Japan . |
| 7-331462 | 12/1995 | Japan . |
| 8-017804 | 1/1996 | Japan . |

*Primary Examiner*—Rodney G. McDonald
*Attorney, Agent, or Firm*—Pillsbury Madison & Sutro LLP

[57] ABSTRACT

After performing an etching process with respect to one substrate, the substrate is taken out from an etching chamber. Then, a dummy substrate is disposed in the etching chamber and a cleaning process is performed. The cleaning process includes a cleaning step for etching reaction products produced during the etching process to be removed, a seasoning step for adjusting the atmosphere within the etching chamber and the temperature of the substrate, and a purge step for removing suspended foreign materials without generating plasma. By performing the cleaning process, the successive etching process can be performed without generating any black silicon on the substrate, thereby attaining a high production yield.

44 Claims, 13 Drawing Sheets

TABLE. 1

| ITEM | ETCHING CONDITION |
|---|---|
| HBr FLOW RATE (sccm) | 60 |
| SF$_6$ FLOW RATE (sccm) | 1.4 |
| SiF$_4$ FLOW RATE (sccm) | 2 |
| He/O$_2$ FLOW RATE (sccm) | 20 |
| RF POWER (W) | 600 |
| PRESSURE (mTorr) | 115 |
| MAGNETIC FLUX DENSITY (G) | 85 |

FIG. 6

TABLE. 2

| ITEM | CLEANING CONDITION | SEASONING CONDITION | PURGE CONDITION |
|---|---|---|---|
| HBr FLOW RATE (sccm) | — | 60 | 60 |
| SF6 FLOW RATE (sccm) | 80 | 2 | 1.4 |
| SiF4 FLOW RATE (sccm) | — | — | 2 |
| He/O2 FLOW RATE (sccm) | 300 | 10 | 20 |
| RF POWER (W) | 300 | 600 | 0 |
| PRESSURE (mTorr) | 20 | 100 | 115 |
| MAGNETIC FLUX DENSITY (G) | | 65 | 0 |
| DUMMY SUBSTRATE | Si SUBSTRATE WITH SiO2 LAYER | Si SUBSTRATE WITH SiO2 LAYER | Si SUBSTRATE WITH SiO2 LAYER |
| PROCESSING TIME (sec.) | 80 | 20 | 60 |

FIG. 9

TABLE. 3

| ITEM | FIRST CLEANING CONDITION | SECOND CLEANING CONDITION | SEASONING CONDITION | PURGE CONDITION |
|---|---|---|---|---|
| HBr FLOW RATE (sccm) | — | — | 60 | 60 |
| SF6 FLOW RATE (sccm) | 80 | 80 | 2 | 1.4 |
| SiF4 FLOW RATE (sccm) | — | — | — | 2 |
| He/O2 FLOW RATE (sccm) | — | — | 10 | 20 |
| RF POWER (W) | 300 | 350 | 600 | 0 |
| PRESSURE (mTorr) | 300 | 100 | 100 | 115 |
| MAGNETIC FLUX DENSITY (G) | 20 | 20 | 65 | 0 |
| DUMMY SUBSTRATE | Si SUBSTRATE WITH SiO2 LAYER | Si SUBSTRATE WITH SiO2 LAYER | Si SUBSTRATE WITH SiO2 LAYER | Si SUBSTRATE WITH SiO2 LAYER |
| PROCESSING TIME (sec.) | 80 | 15 | 20 | 60 |

FIG. 13

TABLE. 4

| ITEM | FIRST CLEANING CONDITION | SECOND CLEANING CONDITION | SEASONING CONDITION | PURGE CONDITION |
|---|---|---|---|---|
| HBr FLOW RATE (sccm) | — | — | 80 | 60 |
| $SF_6$ FLOW RATE (sccm) | 80 | 80 | 1.6 | 1.4 |
| $SiF_4$ FLOW RATE (sccm) | — | — | 3 | 2 |
| $He/O_2$ FLOW RATE (sccm) | — | — | 20 | 20 |
| RF POWER (W) | 400 | 350 | 600 | 0 |
| PRESSURE (mTorr) | 300 | 100 | 100 | 115 |
| MAGNETIC FLUX DENSITY (G) | 20 | 20 | 65 | 0 |
| DUMMY SUBSTRATE | Si SUBSTRATE WITH $SiO_2$ LAYER | Si SUBSTRATE WITH $SiO_2$ LAYER | Si SUBSTRATE WITH $SiO_2$ LAYER | Si SUBSTRATE WITH $SiO_2$ LAYER |
| PROCESSING TIME (sec.) | 300 | 60 | 500 | 60 |

TABLE. 5

| ITEM | CLEANING CONDITION | SEASONING CONDITION |
|---|---|---|
| HBr FLOW RATE (sccm) | — | 60 |
| $SF_6$ FLOW RATE (sccm) | 80 | 2 |
| $SiF_4$ FLOW RATE (sccm) | — | — |
| $He/O_2$ FLOW RATE (sccm) | — | 10 |
| RF POWER (W) | 300 | 100 |
| PRESSURE (mTorr) | 300 | 600 |
| MAGNETIC FLUX DENSITY (G) | 20 | 65 |
| DUMMY SUBSTRATE | Si SUBSTRATE WITH $SiO_2$ LAYER | Si SUBSTRATE WITH $SiO_2$ LAYER |
| PROCESSING TIME (sec.) | 80 | 20 |

TABLE. 6

| ITEM | PURGE CONDITION |
|---|---|
| HBr FLOW RATE (sccm) | 60 |
| $SF_6$ FLOW RATE (sccm) | 1.4 |
| $SiF_4$ FLOW RATE (sccm) | 2 |
| $He/O_2$ FLOW RATE (sccm) ($He:O_2 = 7:3$) | 20 |
| RF POWER (W) | 0 |
| PRESSURE (mTorr) | 115 |
| MAGNETIC FLUX DENSITY (G) | 0 |
| PROCESSING TIME (sec.) | 300 | ns
DRY ETCHING METHOD FOR SEMICONDUCTOR SUBSTRATE

CROSS REFERENCE TO RELATED APPLICATIONS

This application is based upon and claims the benefit of priority of the prior Japanese Patent Applications No. 8-354070 filed on Dec. 17, 1996, and No. 9-257492, filed on Sep. 5, 1997, the contents of which are incorporated herein by reference.

BACKGROUND OF THE INVENTION

1. Field of the Invention

The present invention relates to a dry etching method for forming a trench (deep groove), a deep hole, and the like in a silicon (Si) substrate.

2. Description of the Related Arts

Conventionally, a trench is formed in an Si substrate by an etching method to electrically isolate parts within a semiconductor element formed on the substrate. When forming the trench, a silicon dioxide ($SiO_2$) layer is generally used as an etching mask. In this case, the etching process is performed under conditions such that the $SiO_2$ layer is not easily etched, that is, an etching speed ratio of an etched field (Si substrate) with respect to the etching mask ($SiO_2$), which is herebelow referred to as selectivity, is high. The silicon substrate is etched anisotropically in a depth direction thereof. As a result, a trench having a high aspect ratio can be formed in the silicon substrate.

In this method, however, reaction products which contain silicon and oxygen are produced during the etching process. The reaction products are liable to flocculate and deposit within an etching chamber. The deposited reaction products are further liable to be suspended within the etching chamber. In addition, $SiO_2$ particles are separated from the etching mask. As a result, foreign materials which contain silicon and oxygen are attached to an etched portion of the silicon substrate, and serve as an etching mask. Then, there arises a problem inasmuch as non-etched portions, i.e., etching residues that are called black silicon (Si), are produced.

Processes for producing the etching residues are explained in more detail with reference to FIGS. 1A to 1C. As shown in FIG. 1A, a mask 1 is formed on an Si substrate 2 to be opened at a specific region, with an etched portion 6 formed in the mask 1. Then, the etched portion 6 is etched to form a trench 3. In this case, if a foreign material 5 is deposited on the trench 3 during the etching process as shown in FIG. 1B, the foreign material 5 serves as an etching mask in the successive etching process. As a result, a columnar black Si (etching residue) 4 is formed as shown in FIG. 1C. In a case where the black Si 4 is relatively large in size, an appropriate isolation width of the trench 3 cannot be obtained, so that it becomes difficult to obtain electrical isolation between elements formed on the substrate 2. As the amount of the foreign material 5 is increased, the amount of the black Si 4 is increased, resulting in an increased rate of occurrence of insulation deficiencies of the substrate 2. That is, the black Si 4 is easily generated in the trench 3 under etching conditions in which the reaction products are highly generated. In the above-mentioned trench etching process, because the etching process generates reaction products which contain silicon and oxygen, the probability of producing the black Si is high.

In addition, conventionally, a peripheral portion of the substrate within several millimeters from an outer circumference of the substrate is not covered with the $SiO_2$ etching mask, so that the etching process is performed in a state in which the peripheral portion of the substrate is exposed. Therefore, the black Si is generated on the peripheral portion of the substrate having a width larger than that of the trench. The black Si on the peripheral portion of the substrate can be a foreign material source in the successive etching process.

To solve this problem, the $SiO_2$ mask may be left on the peripheral portion of the substrate. However, in such a case, a ratio of an area of the etched portion of the substrate with respect to the entire area of the substrate becomes small, so that the etching speed of the $SiO_2$ mask is increased to decrease the amount of the reaction products, resulting in low selectivity. Therefore, the etching conditions need to be changed so that the selectivity becomes large to prevent the etching of the $SiO_2$ mask. This means changing the etching conditions to increase the amount of the reaction products. For example, a flow rate of silicon tetrafluoride ($SiF_4$) gas and oxygen ($O_2$) gas, which are used as an etching gas in a mixed state, is increased.

On the other hand, there is a tendency for the edge portion of the mask to be etched by a sputter-etching effect as it becomes close to the outer circumference of the substrate. That is, the larger the diameter of the substrate becomes, the easier the edge portion of the mask is etched. Therefore, when the diameter of the substrate is large, the etching conditions need to be changed so that the selectivity is increased to prevent the mask. However, as mentioned above, increasing the selectivity causes an increase to the amount of the reaction products generated. As a result, the amount of foreign materials attached to the etched portion of the substrate is increased so that the amount of the black Si generated is increased, resulting in isolation deficiencies.

When the generation of the reaction products are suppressed to prevent the occurrence of the black Si, the selectivity becomes small, and when the selectivity is controlled to be large, the amount of the reaction products is increased. An etching method for solving the thus colliding problems is disclosed, for example, in JP-A-8-17804. In the etching method, in a state where an Si substrate that is to be etched (etched substrate) is disposed within an etching chamber, a cleaning process using a gas containing fluorine (F) is performed generating plasma discharge. Accordingly, an exposed naturally oxidized layer on the Si substrate and reaction products that are produced in a previous etching process and deposited within the etching chamber are removed. Then, the next etching process using a gas including chlorine (Cl), iodine (I), and bromine (Br) gases is performed with respect to the Si substrate to form a trench in the substrate. In this case, a shape of the trench is improved by removing the naturally oxidized layer of the substrate. In addition, deposition of the reaction products on the substrate is suppressed by removing the reaction products within the etching chamber.

However, in the above-mentioned etching method, the cleaning process using the gas containing F is performed while the etched substrate is disposed within the etching chamber. Therefore, the shape of the trench in the substrate is affected by the cleaning process, and accordingly, the trench cannot be formed with high accuracy.

SUMMARY OF THE INVENTION

The present invention has been made in view of the above-mentioned problems and an object of the present invention is to provide a dry etching method for forming a trench in a substrate with high accuracy by performing a cleaning process within an etching chamber using a dummy substrate.

In order to achieve the above-mentioned object of the present invention, there is provided a dry-etching method for etching a silicon substrate, including steps of etching the silicon substrate, etching a reaction product produced in the step of etching the silicon substrate, and further etching the silicon substrate. Before the step of etching the reaction product, the silicon substrate is taken out from an etching chamber and alternately a dummy substrate is introduced into the etching chamber. The silicon substrate that is etched after the step of etching the reaction product may be a silicon substrate different from the substrate etched before the step of etching the reaction product. A silicon substrate having an $SiO_2$ layer on a surface thereof can be used as the dummy substrate.

Preferably, the step of etching the reaction product includes a cleaning step for etching the reaction product, and a seasoning step for removing the reaction product from the etching chamber and adjusting an atmosphere within the etching chamber and a temperature of the dummy substrate. The cleaning step may further include a first cleaning step performed at a first pressure and a second cleaning step performed at a second pressure different from the first pressure. More preferably, the step of etching the reaction product includes a purge step for removing foreign materials suspended within the etching chamber, attached to the substrate, or the like, without generating plasma within the etching chamber. The purge step can be performed after the seasoning step.

After performing the above-mentioned method with respect to one lot of the silicon substrates, a lot cleaning process can be performed. The lot cleaning process may involve cleaning, seasoning and purge steps.

Further, according to the present invention, there is provided another dry-etching method including etching processes performed on one substrate and a purge process performed between the etching processes without generating plasma within the etching chamber for removing the reaction product from the etching chamber. The gas used in the purge process is preferably the same as that in the etching processes.

As a result, the reaction products produced during the etching of the silicon substrates can be effectively removed from the etching chamber, so that a specific shape, such as a trench, can be formed in the substrate with high accuracy and without generating any black silicon.

BRIEF DESCRIPTION OF THE DRAWINGS

These and other objects and features of the present invention will become more readily apparent from a better understanding of preferred embodiments described below with reference to the following drawings, in which:

FIG. 6 is a table indicating cleaning, seasoning, and purge conditions in the first embodiment;

FIG. 9 is a table indicating first and second cleaning conditions, and seasoning and purge conditions in the second embodiment;

FIG. 13 is a table indicating first and second cleaning conditions, seasoning conditions, and purge conditions in a third preferred embodiment;

DETAILED DESCRIPTION OF THE PREFERRED EMBODIMENTS

Embodiments according to the present invention will be described hereinunder with reference to the drawings.

First Embodiment

Figure 1A:
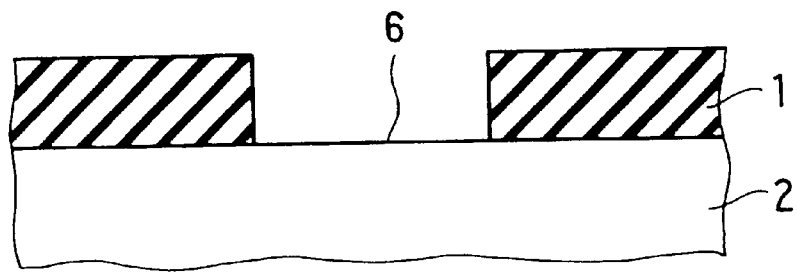
FIGS. 1A to 1C are cross-sectional views schematically showing processes for forming black silicon in a trench according to a prior art process.
Figure 1B:
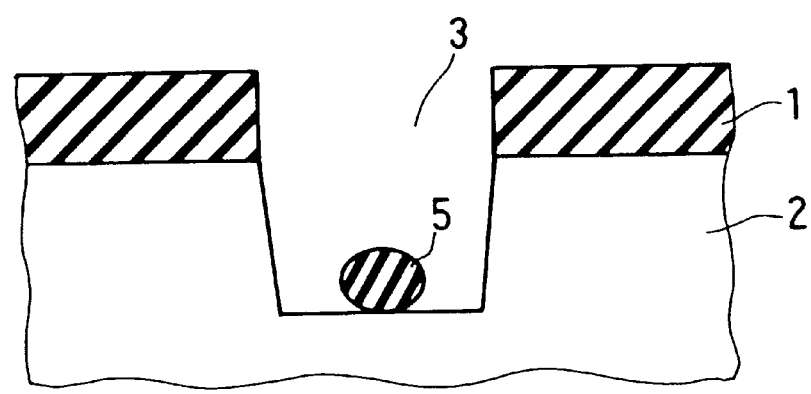
Figure 1C:
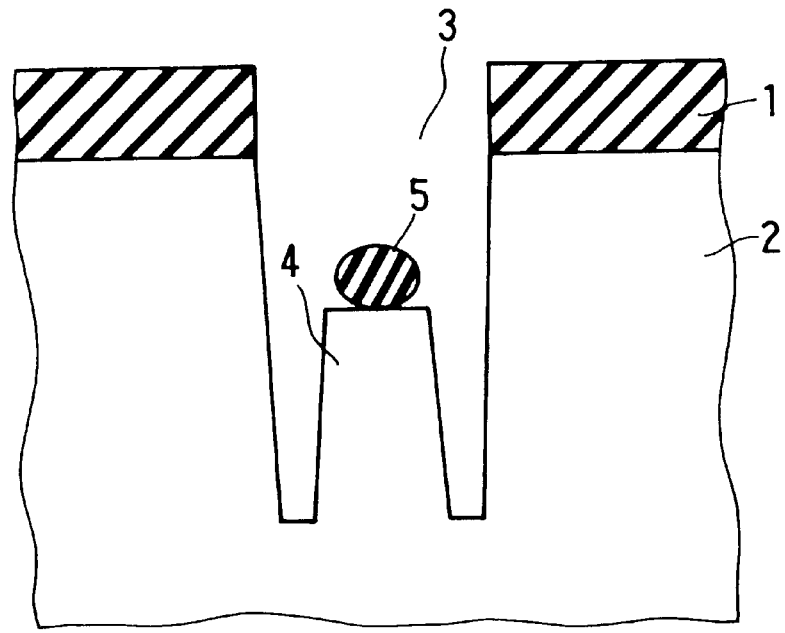
Figure 2:
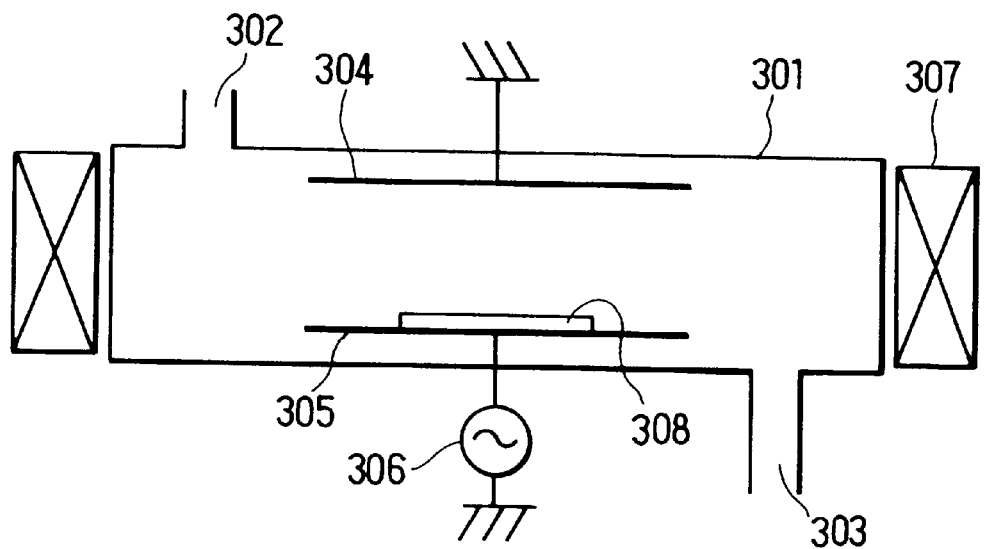
FIG. 2 is a cross-sectional view schematically showing a magnetron reactive ion etching (RIE) apparatus used in embodiments according to the present invention.

In a preferred first embodiment, a reactive ion etching (RIE) apparatus shown in FIG. 2 is used as a dry etching apparatus. An electron cyclotron resonanse (ECR) apparatus, an inductivity coupled plasma (ICP) apparatus, or the like may be used in place of the RIE apparatus.

Figure 3:
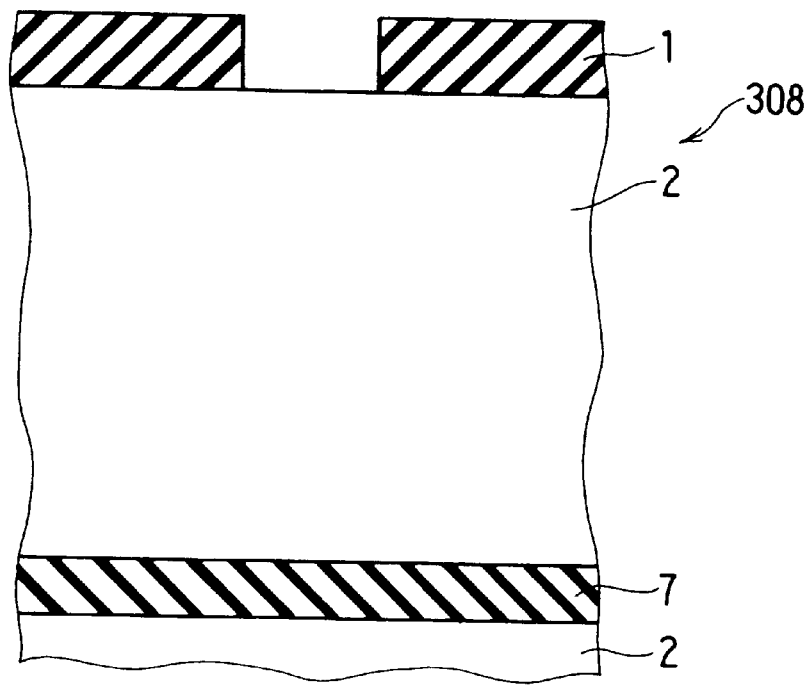
FIG. 3 is a cross-sectional view showing an Si substrate that is used for forming a trench therein by etching in the embodiments.

As shown in FIG. 2, the RIE apparatus has an etching chamber 301, and upper and lower electrodes 304 and 305 are disposed within the etching chamber 301. A substrate 308 shown in FIG. 3 that is an object to be etched is disposed on the lower electrode 305. As shown in FIG. 3, the substrate 308 includes an Si substrate 2, an oxide layer 7 embedded in the Si substrate 2, and a mask 1 made of $SiO_2$ formed on the Si substrate 2. The mask 1 has an opening at an area (etched portion) where the Si substrate 2 is to be etched. The thus constructed substrate 308 is fixed to the lower electrode 305 by a clamp 309 (see FIGS. 7A to 7C). In this state, an etching gas described later is introduced into the chamber 301 through a gas introduction hole 302 and is discharged from an exhaust hole 303. Then, a high frequency power supply 306 supplies power of 13.56 MHz to the electrode 305, so that gas plasma is produced between the electrodes 304 and 305. As a result, the substrate 308 is etched. Here, the RIE apparatus adopts a magnetron system and includes a magnetic coil 307 disposed around the etching chamber 301. In the other embodiments described later, the RIE apparatus shown in FIG. 2 is utilized as well.

Next, etching processes performed on substrates to form trenches therein will be explained. When the etching processes are performed in the above-mentioned RIE apparatus, the employed etching gas is $O_2$ based gas including hydrogen bromide (HBr), sulfur fluoride ($SF_6$), $SiF_4$, and helium (He) (herebelow referred to as He, $O_2$ gas). The etching processes are performed under conditions shown in FIG. 4 (TABLE. 1). Although in the He, $O_2$ gas, a ratio of the He gas with respect to the $O_2$ gas, i.e., He:$O_2$ is approximately 7:3 in this embodiment, the $O_2$ gas may be used alone provided that the flow rate of the gas can be controlled. Further, the etching gas may include inert gases other than the He gas.

Figures 4, 5:
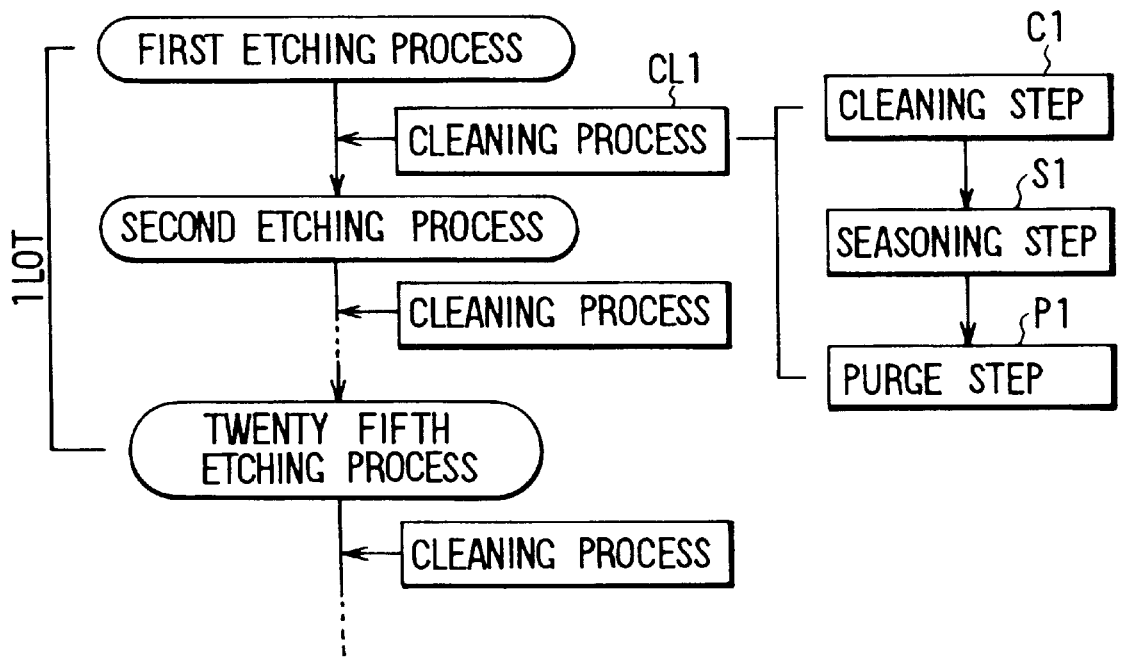
FIG. 4 is a table indicating conditions of an etching process in the embodiments.
FIG. 5 is a flow chart showing etching processes in a first preferred embodiment.

In this embodiment, every time one etching process with respect one substrate 308 is finished, a dry cleaning process using a dummy substrate for cleaning within the etching chamber 301 is performed. As an example, FIG. 5 shows a flow chart of the etching processes. In FIG. 5, first to twenty fifth etching processes are respectively performed on first to twenty fifth substrates, and a cleaning process CL1 is performed after each of the etching processes is finished. In this case, twenty five substrates constitute one lot. Specifically, after one etching process for one substrate 308 is finished, the etched substrate 308 is taken out from the etching chamber 301. Alternately, the dummy substrate for cleaning is disposed within the etching chamber 301 at the position where the substrate 308 was disposed. The dummy substrate has an Si substrate and an $SiO_2$ layer formed on the Si substrate. Then, the cleaning process CL1 is performed. In the cleaning process CL1, after a cleaning step C1 is performed for 80 seconds, a seasoning step S1 is performed for 20 seconds, and thereafter, a purge step P1 is performed for 60 seconds. After performing the cleaning process CL1, the dummy substrate is replaced with the next etched substrate 308.

The conditions of the steps C1, S1, and P1 in the cleaning process CL1 are shown in FIG. 6 (TABLE. 2). In the cleaning step C1, the reaction products deposited on the upper electrode 304, the lower electrode 305, the inside wall of the etching chamber 301, and on the clamp 309 are removed by etching using only the $SF_6$ gas. By performing the cleaning step C1, in the next etching process for the next substrate, the separation of the reaction products which contain silicon and oxygen from the inside wall of the etching chamber 301 and the like can be prevented. Consequently, the attachment of foreign materials to the etched portion of the etched substrate can be prevented.

The seasoning step S1 is performed to adjust the atmosphere within the etching chamber 301 and the temperature of the substrate, and to remove the reaction products etched in the cleaning step C1. Gas conditions in the seasoning step S1 are similar to those in the etching process shown in FIG. 4. The gas conditions in the seasoning step S1 are controlled such that a total flow rate of the HBr, $SF_6$, and $O_2$, gases that contribute to the formation of the reaction products is decreased compared to those in the etching process. Accordingly, the reaction products are prevented from being further produced in the seasoning step S1. More preferably, the $SiF_4$ gas is not introduced into the etching chamber in the seasoning step S1 as shown in FIG. 6. This is because when the $SiF_4$ gas and the $O_2$ gas are introduced into the chamber at the same time, $SiO_2$ is produced.

The purge step P1 is performed to removed suspended foreign materials remaining within the etching chamber 301 even after the seasoning step S1 is performed. Gas conditions in the purge step P1 are also similar to those in the etching process. A main difference in conditions between the purge step P1 and the etching process is that an RF power in the purge step P1 is set to be zero, so that gas plasma is not generated within the etching chamber 301. Accordingly, in the purge step P1, the gas flows in the etching chamber 301 without generating the gas plasma.

Figure 7A:
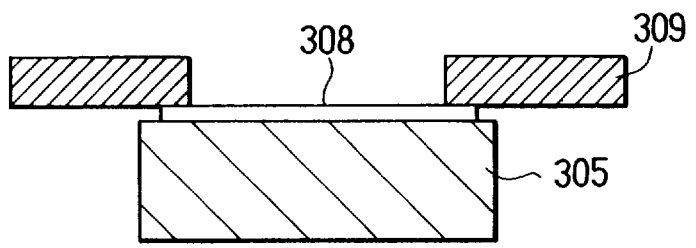
FIGS. 7A to 7C are cross-sectional views showing the Si substrate fixed by a clamp for explaining an effect in the first embodiment.
Figure 7B:
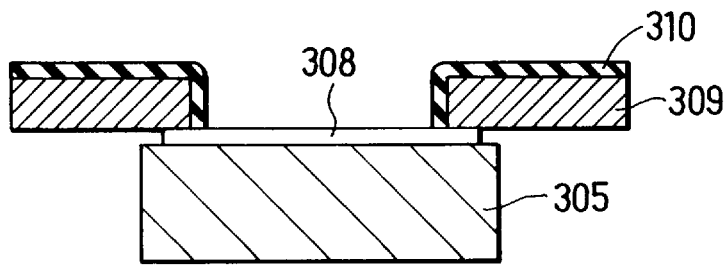
Figure 7C:
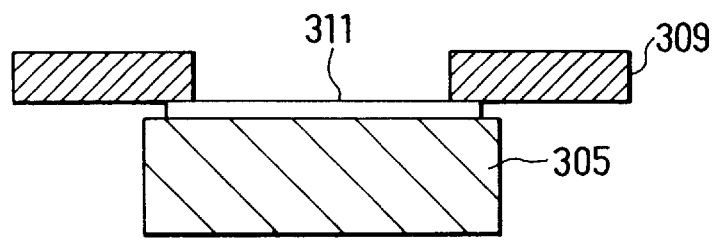

An example of effects of performing the cleaning process CL1 will be explained in more detail referring to FIGS. 7A to 7C. That is, in the etching process, the substrate 308 is etched while being fixed to the lower electrode 305 by the clamp 309 as shown in FIG. 7A. During the etching process, the reaction products are produced and deposited within the etching chamber 301 as well as on the clamp 309 as shown in FIG. 7B. In FIG. 7B, the deposited reaction products are indicated with reference numeral 310. Conventionally, separation of these reaction products causes particles to deposit on the etched portion, resulting in the occurrence of etching residues (black Si). However, in this embodiment, every time one etching process is finished, the reaction products are removed in the cleaning process using the dummy substrate. Accordingly, as shown in FIG. 7C, the reaction products are not deposited on the clamp 309 and the like. In FIG. 7C, reference numeral 311 shows the dummy substrate. Accordingly, when the next etching process is performed, the particles of the reaction products prevented from being attached to the etched portion of the substrate. Consequently, the etching residues caused by the particles can be reduced.

In the first embodiment, the substrate having the $SiO_2$ layer on the surface thereof is used as the dummy substrate. This is because an etching speed of the $SF_6$ gas with respect to Si is larger than that with respect to $SiO_2$. When an Si substrate not having an $SiO_2$ layer thereon is used, the $SF_6$ gas is consumed by the etching of the Si substrate, and accordingly, the efficiency at which the reaction products are removed deteriorates. Therefore, by employing the dummy substrate having a surface region made of $SiO_2$, the consumption of the $SF_6$ gas is suppressed, and the efficiency at which the reaction products are removed can be enhanced. The gas used in the seasoning step S1 also has a large etching speed with respect to Si. Therefore, it is desirable that the surface region of the dummy substrate used in the seasoning step S1 be made of $SiO_2$.

The dummy substrate used in the first embodiment is formed in the following way. First, an Si substrate is thermally oxidized so that a first $SiO_2$ layer having a thickness of 0.95 $\mu$m is formed on the surface of the substrate. Then, a second $SiO_2$ layer is deposited on the first $SiO_2$ layer by a CVD method to have a thickness of 1 $\mu$m. The $SiO_2$ layer of the dummy substrate is etched at 1250 Å in the cleaning step C1 and at 15 Å in the seasoning step S1. Therefore, the thus formed dummy electrode can be used 15 times for the cleaning processes.

Second Embodiment

A second preferred embodiment is characterized in that the cleaning step in a cleaning process CL2 further includes first and second cleaning steps C21 and C22 so that reaction products within an etching chamber 301 are more effectively removed. The parts similar to those in the first embodiment are indicated by the same reference numerals and description thereof will be omitted.

Figure 8:
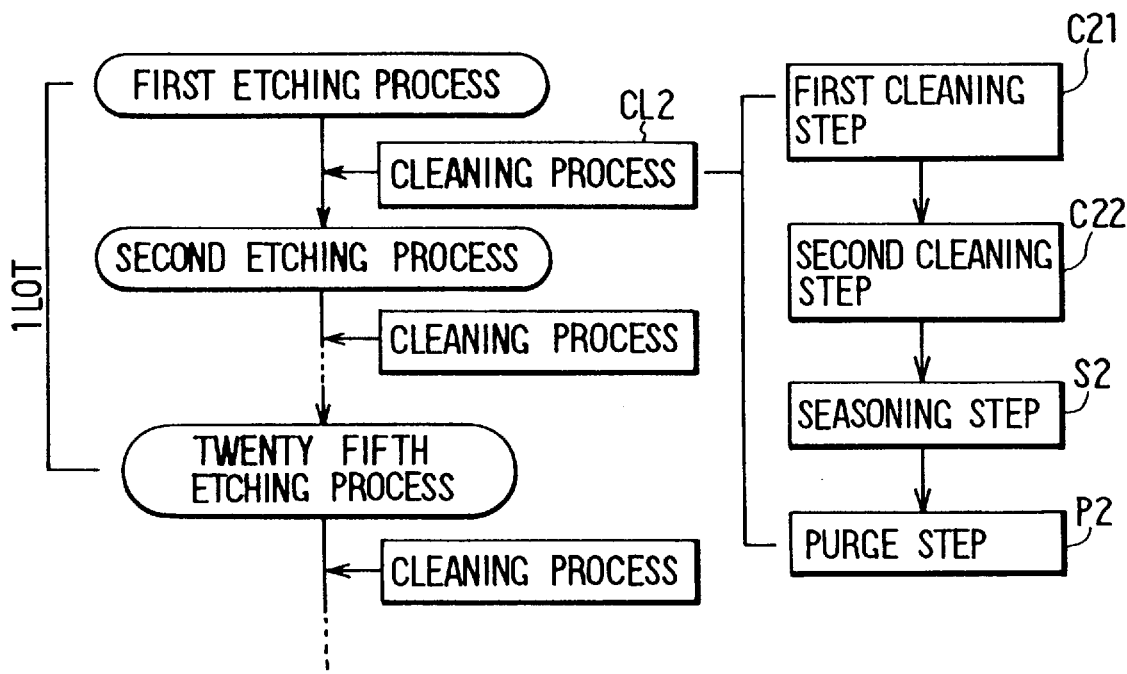
FIG. 8 is a flow chart showing etching and cleaning processes in a second preferred embodiment.
Figure 10:
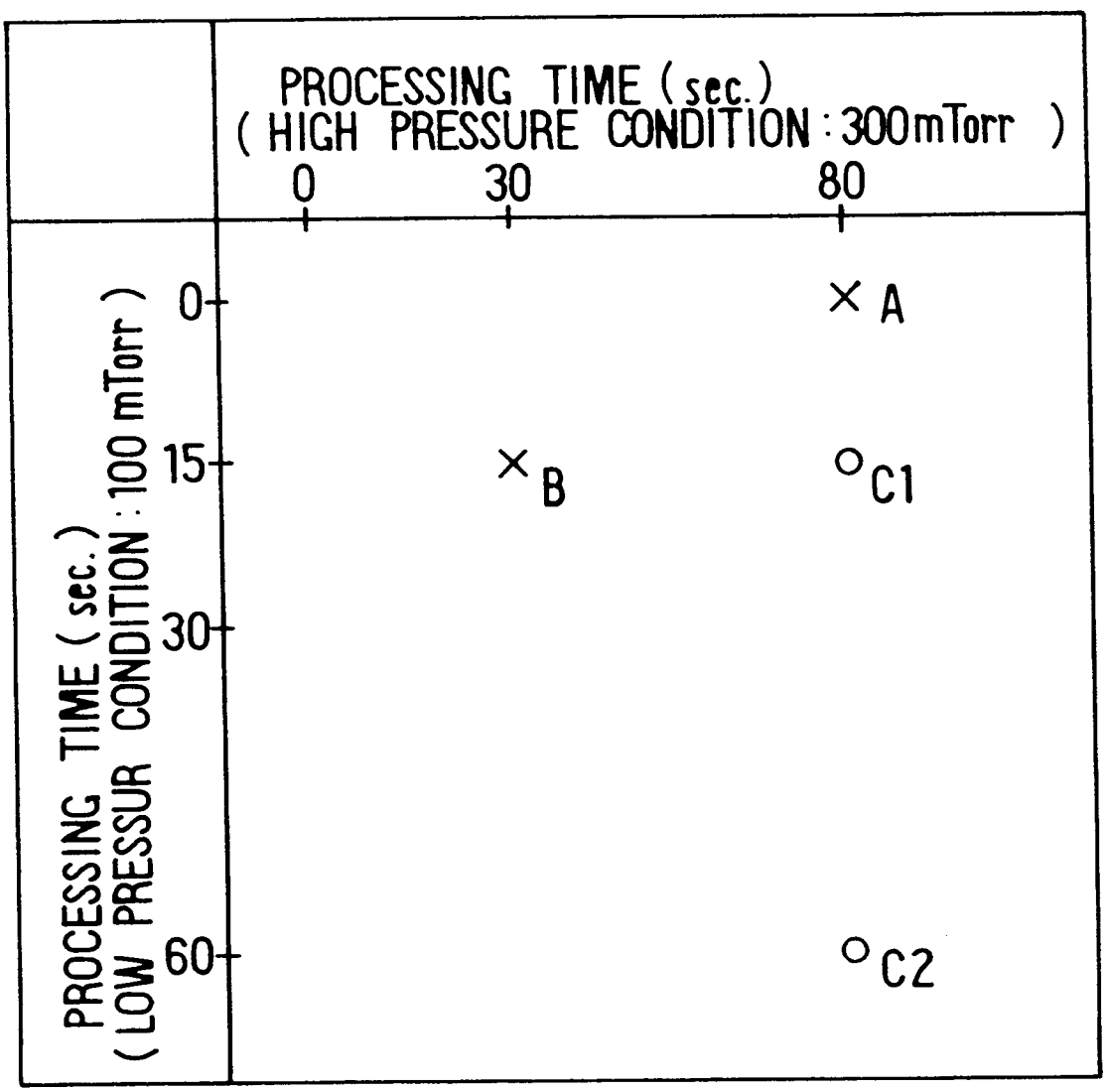
FIG. 10 is a graph showing conditions of cleaning steps for evaluating deposition states of reaction products on clamps in the second embodiment.

Specifically, as shown in FIG. 8, after each of the etching processes is finished, the cleaning process CL2 is performed. In the cleaning process CL2, the first cleaning step C21, the second cleaning step C22, a seasoning step S2, and a purge step P2 are performed in that order. The cleaning process CL2 is performed while a dummy substrate 312 is disposed within the etching chamber 301 in place of a substrate 308 as in the first embodiment.

FIG. 9 (TABLE. 3) shows conditions of the steps C21, C22, S2, and P2. The conditions of the first cleaning step C21, the seasoning step S2, and the purge step P2 are the same as those of the cleaning step C1, the seasoning step S1, and the purge step P1 in the first embodiment. The second cleaning step C22 is performed under pressure and a higher RF power conditions compared to those in the first cleaning step C21. Accordingly, plasma is concentrated on the central portion of the etching chamber 301 to enhance physical etching effect there. As a result, the reaction products deposited on areas close to the substrate can be effectively removed.

The above-mentioned effect will be explained in more detail based on results of experiments shown in FIGS. 10 and 11A to 11D. The processing times of each of the first and second cleaning steps C21 and C22 respectively performed under high and low pressure conditions were changed, and under conditions T1, T2, T3, and T4 shown in FIG. 10, deposition states of the reaction products on the clamps 309 were observed. More specifically, each of the clamps 309 was observed after the etching processes for one lot (constituted of twenty five substrates) were finished under the same conditions. The deposition states of the reaction products on the clamps 309 are schematically shown in FIGS. 11A to 11D, in which hatched areas indicate areas of the clamps 309 where the reaction products 310 were observed.

Figure 11A:
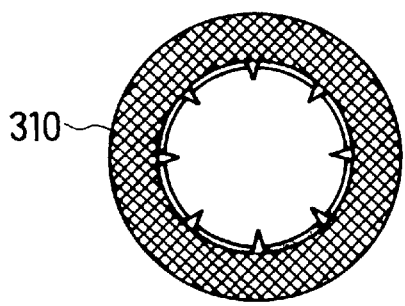
FIGS. 11A to 11D are plan views showing the states of the reaction products on the clamps in accordance with the conditions shown in FIG. 10.
Figure 11B:
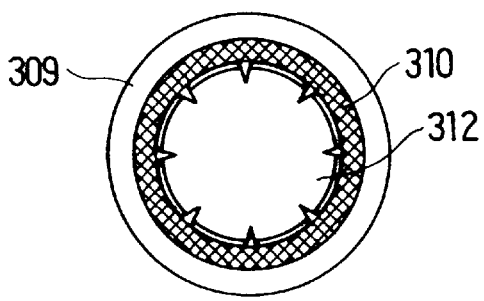
Figure 11C:
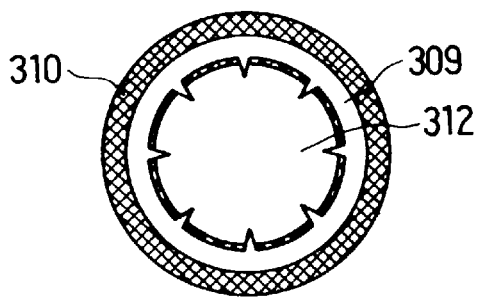

When no cleaning processes were performed, the reaction products were deposited on the entire area of the clamp 309 as shown in FIG. 11A. By performing the first cleaning step C21 under a pressure of 300 mTorr for 80 seconds, i.e., under the conditions T1 shown in FIG. 10, the reaction products on the clamp 309 were etched as shown in FIG. 11B. However, in this state, the reaction products 310 remained on the inner circumferential side of the clamp 309. When the first cleaning step C21 was performed under 300 mTorr for 30 seconds and the second cleaning step C22 was performed under 100 mTorr for 15 seconds, i.e., under the conditions T2 shown in FIG. 10, the reaction products 310 remained on the outer circumferential side of the clamp 309 and on side faces of claws of the clamp 309 as shown in FIG. 11C.

Accordingly, it is understood that the above-mentioned low pressure condition (second cleaning step) of 100 mTorr is effective to remove the reaction products deposited on the inner circumferential side of the clamp 309, i.e., on the central portion of the etching chamber 301, but not effective to remove the reaction products on a peripheral portion apart from the center of the chamber. This is because plasma is concentrated on the central portion of the etching chamber 301 under the low pressure condition. On the other hand, under the above-mentioned high pressure condition of 300 mTorr, a relatively isotropic etching can be performed. Therefore, the reaction products within the etching chamber can be uniformly removed. However, the amount of the reaction products deposited on the central portion of the substrate is large compared to that on the peripheral portion of the substrate. Therefore, even if the cleaning step is performed under the high pressure condition, it is difficult to satisfactorily remove the reaction products. Because of this, in the second embodiment, the first cleaning step C21 performed under the high pressure condition and the second cleaning step C22 performed under the low pressure condition are combined. Accordingly, the reaction products within the etching chamber as well as on the clamp 309 can be efficiently removed.

Figure 11D:
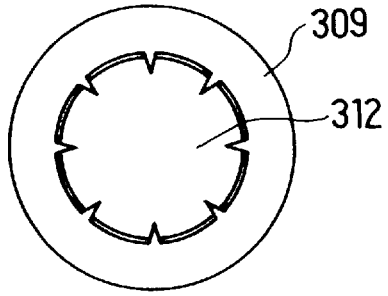

Under the low pressure condition, an etching speed of the reaction products at the central portion of the etching chamber 301 becomes large, and simultaneously an etching speed of the $SiO_2$ layer on the dummy substrate 312 becomes large. Therefore, it is desired that the processing time of the second cleaning step C22 is set as small as possible. In the second embodiment, the processing time of the second cleaning step C22 is set at 15 seconds. In both cases where the first and second cleaning steps C21 and C22 were performed under the conditions T3 and T4 shown in FIG. 10, it was confirmed that the reaction products on the clamp 309 were effectively removed as shown in FIG. 11D.

Figure 12:
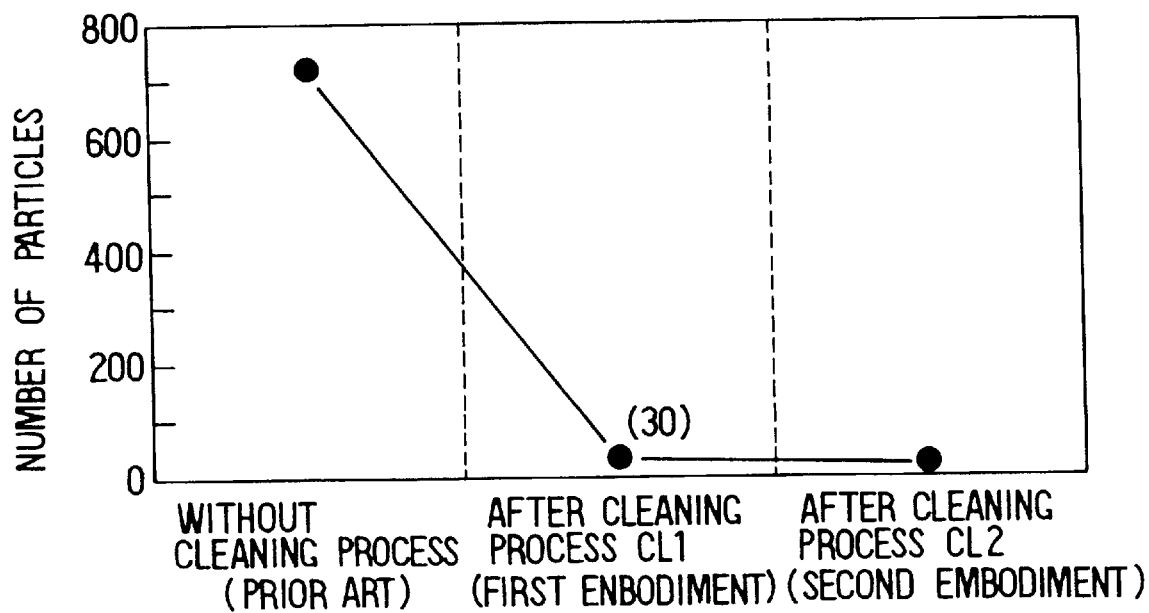
FIG. 12 is a graph showing the number of the reaction products deposited on the clamps in the etching processes in the first and second embodiments.

Next, after the etching processes for one lot were finished under respective conditions of the prior art, the first embodiment and the second embodiment, the numbers of reaction product particles deposited on the clamps 309 were counted. The results are shown in FIG. 12. The counted particles had diameters larger than 0.3 $\mu$m. In the case where the cleaning process was not performed as in the prior art, the number of particles was more than 700. The area of the clamp 309 where the particles were deposited was similar to that shown in FIG. 11A. In the case where the cleaning process CL1 in the first embodiment was performed after each of the etching processes was performed, the number of particles was decreased to be approximately 30. The area of the clamp 309 where the particles were deposited was similar to that shown in FIG. 11B. Further, in the case where the cleaning process CL2 in the second embodiment was performed after each of the etching processes was performed, the number of particles was further decreased. In this way, in the second embodiment, by performing the cleaning process CL2 including the first and second cleaning steps C21 and C22, the number of reaction product particles deposited on the clamp 309 were significantly reduced.

In the second embodiment, the first cleaning step C21 is performed under the high pressure condition, while the second leaning step C22 is performed under the low pressure condition. However, the first cleaning step C21 may be performed under the low pressure condition, and the second cleaning step C22 may be performed under the high pressure condition.

The dummy substrate 312 used in the second embodiment includes an Si substrate, a first $SiO_2$ layer formed on the Si substrate by thermal oxidization to have a thickness of 0.95 $\mu$m, and a second $SiO_2$ layer formed on the first $SiO_2$ layer by the CVD method to have a thickness of 2 $\mu$m. The $SiO_2$ layer of the dummy substrate 312 is etched at 1850 Å in the cleaning process CL2. Therefore, one dummy substrate 312 can be used 15 times for the cleaning process CL2 as well as in the first embodiment.

Third Embodiment

A third preferred embodiment is characterized in that a lot cleaning process R1 is adopted. The lot cleaning process R1 is performed after all etching processes and cleaning processes for one lot are finished, so that reaction products remaining within an etching chamber 301 are further reduced. The lot cleaning process R1 is similar to the cleaning process CL2 in the second embodiment, and it is performed using a dummy substrate under conditions shown in FIG. 13 (TABLE. 4).

Figure 14:
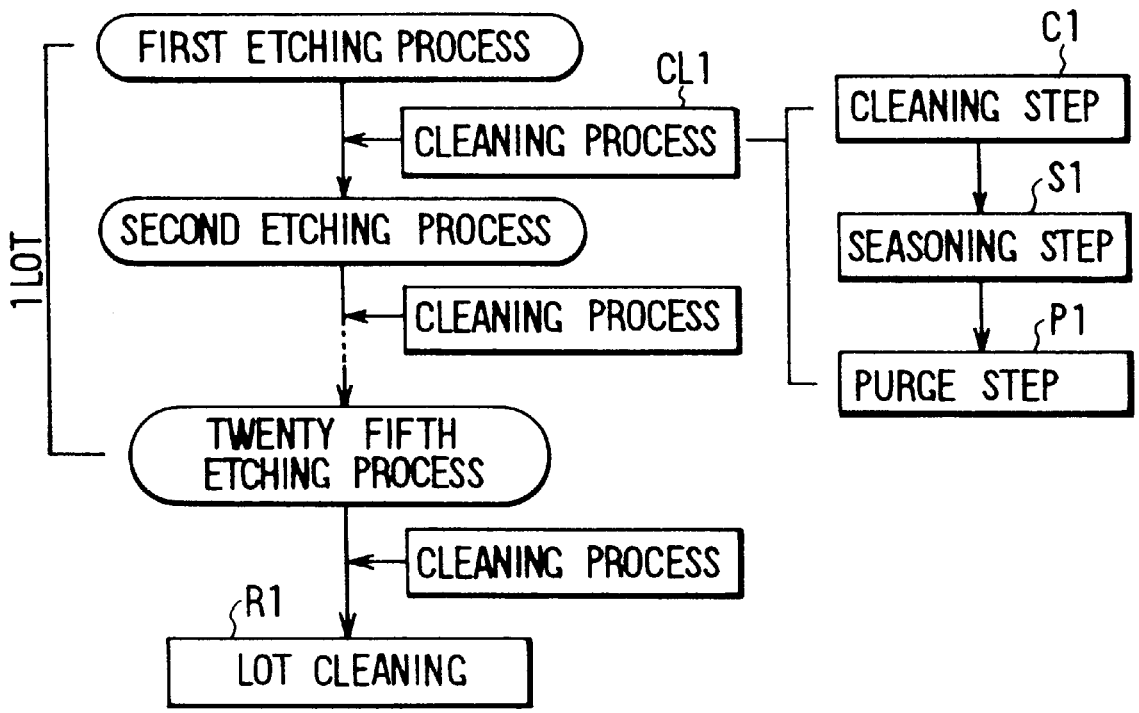
FIG. 14 is a flow chart showing etching and cleaning processes in the third embodiment.

By combining the third embodiment with the first or second embodiment, the reaction products can be more effectively removed. A flow chart of etching processes to which the first and third embodiments are applied is shown in FIG. 14 as an example. Conventionally, when the reaction products within the etching chamber were not sufficiently removed, the etching chamber was opened to be washed. However, in the third embodiment, the frequency at which the etching chamber needs to be washed is decreased, so that manufacturing efficiency is improved.

Fourth Embodiment

In a fourth preferred embodiment, an etching process for one substrate is divided into several etching steps, and a cleaning process for removing reaction products from an etching chamber are performed between the etching steps. The cleaning process includes a cleaning step C3 and a seasoning step S3. Accordingly, foreign materials attached to an etched portion of the substrate can be decreased.

Figure 15:
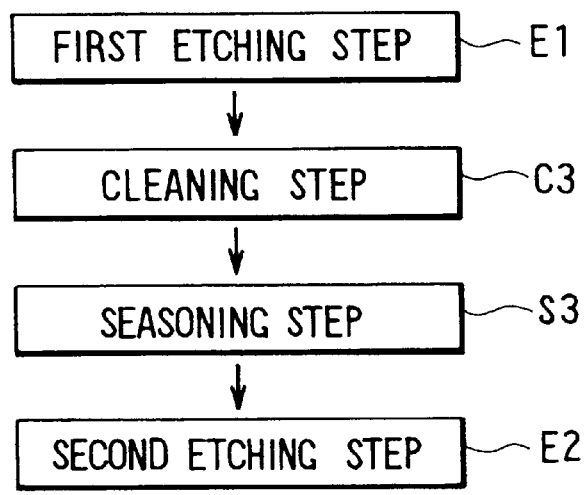
FIG. 15 is a flow chart showing an etching process in a fourth preferred embodiment.

Specifically, as shown in FIG. 15, first, a first etching step E1 is performed on the substrate under the conditions shown in FIG. 4 for 600 seconds. Next, the etched substrate is taken out from the etching chamber and a dummy substrate having an $SiO_2$ layer is disposed within the etching chamber in place of the etched substrate. Then, the cleaning step C3 is performed for 80 seconds under conditions shown in FIG. 16 (TABLE. 5). An etching gas used in the cleaning process C3 is composed of $SF_6$. The reaction products that are attached to upper and lower electrodes, the inside wall of the etching chamber, and the like during the first etching step E1 are removed by the cleaning process C3. Accordingly, foreign materials generated by separation of the reaction products are prevented from depositing on the etched portion of the substrate in the next etching step.

Figures 16, 17:
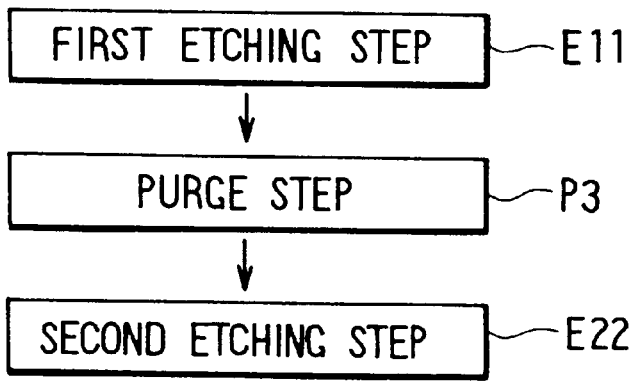
FIG. 16 is a table indicating cleaning and seasoning conditions in the fourth embodiment.
FIG. 17 is a flow chart showing an etching process in a fifth preferred embodiment.

Subsequently, the seasoning step S3 is performed for 20 seconds under conditions shown in FIG. 16. In the seasoning step S3, the atmosphere within the etching chamber and the substrate temperature are adjusted, and, simultaneously, suspended reaction products that are etched in the cleaning step C3 are removed from the etching chamber. After performing the seasoning step S3, the etched substrate is returned to the previous position on the lower electrode, and then, a second etching step E2 is performed for 1000 seconds, thereby forming a trench having a specific shape in the substrate.

In the fourth embodiment, the cleaning process is performed after each etching process to remove the reaction products within the etching chamber. Accordingly, the amount of foreign materials attached to the substrate is further decreased to suppress the occurrence of black Si, resulting in improvement to product yield. Further, the cleaning process is performed while disposing the etched substrate out of the etching chamber. Therefore, the shape of the trench that is to be formed in the substrate is not affected by the cleaning process. In addition, because the atmosphere within the etching chamber and the substrate temperature are controlled by the seasoning step S3, the second etching step E2 following the seasoning step S3 can be smoothly and promptly performed. Provided that the above-mentioned effects can be obtained, it is apparent that the conditions of the cleaning and seasoning steps C3 and S3 shown in FIG. 16 may be changed. For example, although the $SF_6$ gas is used in the above-mentioned cleaning step C3 as the etching gas, nitrogen fluoride ($NF_3$) gas may be used to efficiently remove the reaction products. To more completely remove the reaction products (foreign materials) suspended in the etching chamber or attached to the substrate or the like, a purge step may be performed.

Fifth Embodiment

Figures 18, 20:
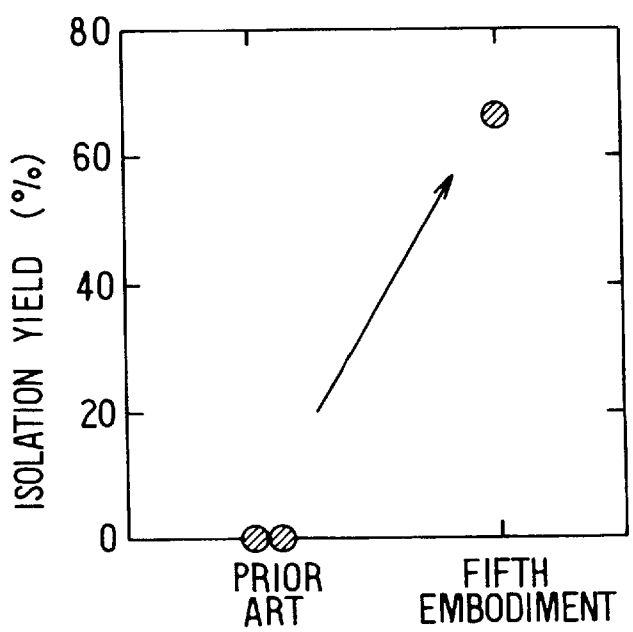
FIG. 18 is a table indicating purge conditions in the fifth embodiment.
FIG. 20 is a graph showing isolation yields in the fifth embodiment of the present invention and in a prior art process.

A fifth preferred embodiment is most characterized in that one etching process for one substrate is divided into several etching steps and purge steps are respectively performed between the successive etching steps. As an example, the etching process in the fifth embodiment is indicated in FIG. 17. That is, after performing a first etching step E11 under the conditions shown in FIG. 4 for 600 seconds, a purge step P3 is performed for 300 seconds. Then, a second etching step E22 is performed under the same conditions as the first etching step E11 for 1000 seconds. Conditions for performing the purge step P3 are shown in FIG. 18 (TABLE. 6). The composition of the gas used in the purge step P3 is the same as that in the first and second etching steps E11 and E22. An RF power is set to be zero so as not to generate gas plasma within the etching chamber, so that the gas flows in the etching chamber without generating gas plasma during the purge step P3.

Figure 19A:
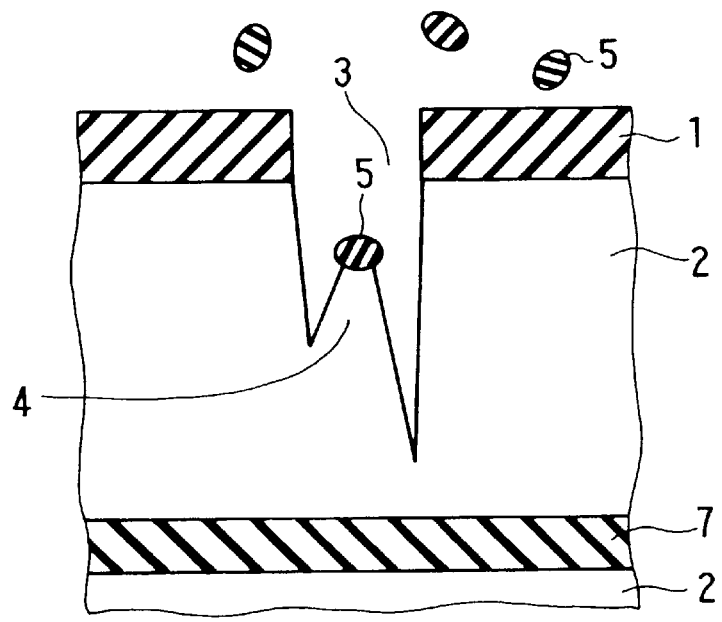
FIGS. 19A and 19B are cross-sectional views showing substrates in formation processes of trenches for explaining an effect in the fifth embodiment.
Figure 19B:
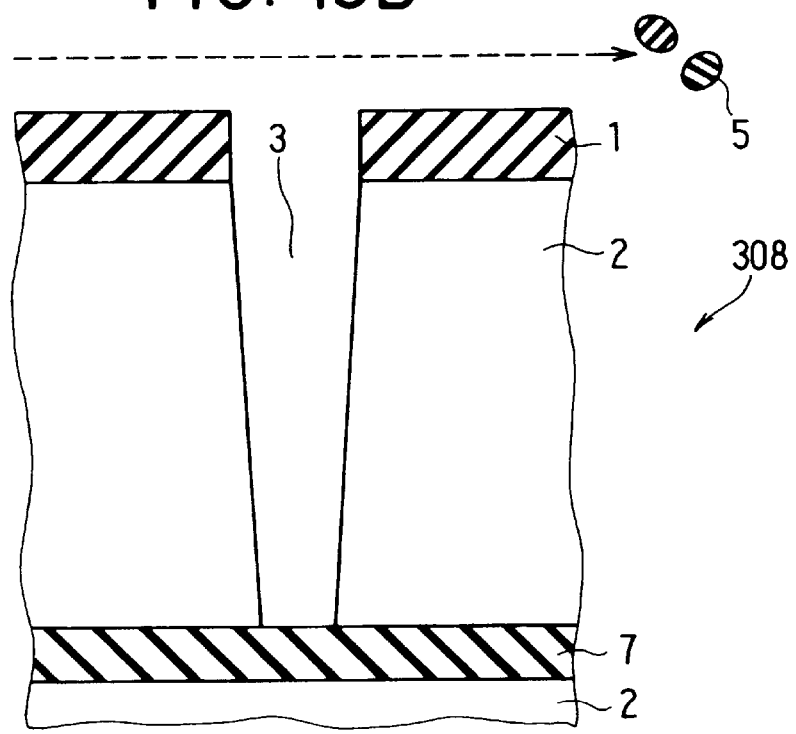

In the case where the etching process is continuously performed, as shown in FIG. 19A, the etching process is performed in the state where foreign materials 5 are suspended within the etching chamber and attached to a face of a trench 3 and the like. Therefore, the foreign materials 5 attached to the face of the trench 3 serve as a mask to form black Si (etching residues) 4. This makes it difficult to obtain sufficient electrical isolation between both sides of the trench 3. On the other hand, in the fifth embodiment, the etching process is divided into the etching steps E11 and E22, and the above-mentioned purge step P3 is performed between the etching steps E11 and E22. Therefore, as shown in FIG. 19B, the foreign materials 5 suspending within the etching chamber or attached to the substrate and the like are removed to prevent occurrence of the black Si 4. In FIG. 19B, a dotted arrow shows a flow of the gas used in the purge step P3. As a result, the electrical isolation between the both sides of the trench 3 can be sufficiently provided. In this way, according to this embodiment, because an amount of occurrence of black Si 4 can be reduced, electrical isolation yield of the trench 3 was improved to be approximately 70% as shown in FIG. 20. As opposed to this, when not only the purge step P3 but also the cleaning processes in the above-mentioned embodiments were not performed, the electrical isolation yield of the trench 3 was approximately 0%.

In the fifth embodiment, because the composition and flow rate of the gas used in the purge step P3 are controlled to be the same as those in the first and second etching steps E11 and E22, the atmosphere within the etching chamber in the purge step P3 can be maintained at the same state as in the etching steps E11 and E22. Accordingly, the second etching step E22 can be promptly and stably performed after the purge step P3 is finished.

In the purge step P3, it is not always necessary to use the gas containing $O_2$ that contributes to the formation of a protection layer and the gas containing Br that contributes to the etching of the substrate. Alternatively, the gas containing F such as the $SF_6$ gas that contributes low selectivity can be used with a large flow rate. The effects of the purge step P3 become large as the processing time of the purge step P3 becomes long. However, when the processing time is so long that the temperature of the substrate is lowered, there is a possibility that etching properties of the substrate are changed. Therefore, the processing time of the purge step P3 needs to be set in a range that does not change the temperature of the substrate. Provided that these conditions (atmosphere within the etching chamber and change in temperature of the substrate) are satisfied, the processing time of the purge step P3 may be changed. For example, the processing time of the purge step P3 can be set to be 20% to 80% with respect to the processing time of one of the etching step. In the fifth embodiment, because the conditions of the purge step P3 are set not to affect the etching properties with respect to the substrate, the etching properties necessary for forming the trench 3 such as high anisotropy, high selectivity, uniformity of the etching speed and the like can be maintained in each of the etching steps E11 and E22.

Further, in the fifth embodiment, the etching process is divided into several etching steps, for example, into the etching steps E11 and E22. Accordingly, the processing time of each etching step can be shortened, so that the amount of foreign materials generated during the each etching step can be reduced.

In each of the above-mentioned embodiments, although the etching processes (etching steps) are performed under the conditions shown in FIG. 4, the conditions are not limited to those. The conditions of the etching process for satisfactory forming the trench are, for example, a flow rate of the HBr gas in a range of 10 sccm to 100 sccm, a flow rate of the $SF_6$ gas in a range of 1 sccm to 10 sccm, a flow rate of the $SiF_4$ gas in a range of 0 to 20 sccm, and a flow rate of $He/O_2$ gas in a range of 2 sccm to 20 sccm. Further, an RF power in a range of 200 W to 600 W and a magnetic flux density in a range of 0 to 100 G are also considered as appropriate conditions for the etching process.

In each of the above-mentioned embodiments, although the gas for the etching process adopts the composition shown in FIG. 4, the gas may be composed of gas including Br such as the HBr gas, gas including a halogen element such as the $SF_6$ gas, and nitrogen ($N_2$) gas. In this case, the etching of the substrate progresses by the gas including Br, the reaction products are volatilized by the gas including a halogen element to be removed, and silicon nitride (SiN) is produced by the $N_2$ gas to protect the side walls of the trench and the $SiO_2$. As a result, the selectivity can be improved and the trench having a required shape can be obtained. Further, the gas for the etching process may be composed of gas including oxygen (O) and $Cl_2$ gas or gas including chlorine (Cl). The $Cl_2$ gas or the gas including Cl increases the etching speed of the substrate, while the gas including O forms a protection layer on the side walls of the trench to increase the selectivity with respect to the mask. As a result, the trench can be formed at a high speed.

By changing the composition of the gas for the etching process, the purge step can be performed with a gas having the same composition and the same flow rate as in the etching process. In the purge step, the supply of an electric power is stopped. In the cleaning step, it is sufficient that the gas includes at least one of the $SF_6$ and $NF_3$ gases for etching reaction products which contain SiN or $SiO_2$.

Although the dummy substrate described above is made of the Si substrate carrying the $SiO_2$ layer on the surface thereof, a quartz substrate and the like may be used as the dummy substrate. In the above-mentioned embodiments, it is apparent that a plasma stabilization process and a flow rate stabilization process can be performed between the processes (steps).

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for respectively dry-etching first and second substrates made of silicon, comprising:

etching the first substrate within an etching chamber;

taking the first substrate out of the etching chamber;

disposing a dummy substrate having a surface portion within the etching chamber, the surface portion being made of a material different than silicon;

etching a reaction product produced in the step of etching the first substrate;

taking the dummy substrate out of the etching chamber;

disposing the second substrate within the etching chamber; and etching the second substrate, wherein said etching of the reaction product includes a cleaning step of etching the reaction product, and a seasoning step of removing the reaction product from the etching chamber and adjusting an atmosphere within the etching chamber and a temperature of the dummy substrate, wherein HBr, $SiF_4$, and $O_2$ gases are used in the steps of etching the first and second substrates and in the seasoning step, and wherein a total flow rate of the HBr, $SiF_4$, and $O_2$ which is introduced into the etching chamber in the seasoning step is smaller than that in the etching steps.

2. The method of claim 1, wherein a flow rate of the $SiF_4$ gas in the seasoning step is substantially zero.

3. A method for respectively dry-etching first and second substrates made of silicon, comprising:

etching the first substrate within an etching chamber;

taking the first substrate out of the etching chamber;

disposing a dummy substrate having a surface portion within the etching chamber, the surface portion being made of a material different than silicon;

etching a reaction product produced in the step of etching the first substrate;

taking the dummy substrate out of the etching chamber;

disposing the second substrate within the etching chamber; and etching the second substrate, wherein said etching of the reaction product includes a cleaning step of etching the reaction product, and a seasoning step of removing the reaction product from the etching chamber and adjusting an atmosphere within the etching chamber and a temperature of the dummy substrate, wherein in said etching of the first substrate, the first substrate is fixed to an electrode by a clamp within the etching chamber, wherein said method further includes a purge step of removing foreign materials from the etching chamber in which a portion of the foreign materials is suspended within the etching chamber and another portion of the foreign materials is attached to the electrode, a wall of the etching chamber, and the clamp, the purge step being performed without generating plasma after performing the cleaning and seasoning steps, and wherein a gas used in the purge step has a composition substantially the same as that used in the steps of etching the first and second substrates.

4. The method of claim 3, wherein:

gas conditions in the purge step are substantially the same as those in the steps of etching the first and second substrates; and the purge step is performed without generating plasma, while the steps of etching the first and second substrates are performed to generate plasma within the etching chamber.

5. A method for respectively dry-etching first and second substrates made of silicon, comprising:

etching the first substrate within an etching chamber;

taking the first substrate out of the etching chamber;

disposing a dummy substrate having a surface portion within the etching chamber, the surface portion being made of a material different than silicon;

etching a reaction product produced while etching the first substrate;

taking the dummy substrate out of the etching chamber;

disposing the second substrate within the etching chamber; and etching the second substrate, wherein said etching of the reaction product includes a cleaning step of etching the reaction product, and a seasoning step of removing the reaction product from the etching chamber and adjusting an atmosphere within the etching chamber and a temperature of the dummy substrate, wherein in the step of etching the first substrate, the first substrate is fixed to an electrode by a clamp within the etching chamber, wherein said method further includes a purge step of removing foreign materials from the etching chamber in which a portion of the foreign materials is suspended within the etching chamber and another portion of the foreign materials is attached to the electrode, a wall of the etching chamber, and the clamp, the purge step being performed without generating plasma after performing the cleaning and seasoning steps, wherein the dummy substrate has an $SiO_2$ layer on a surface thereof, and wherein the purge step is performed under conditions such that an etching speed ratio of the first and second substrates with respect to the $SiO_2$ layer is small compared to that in the steps of etching the first and second substrates if plasma is generated in the purge step, and such that a flow rate of a gas used in the purge step is larger than that in the steps of etching the first and second substrates.

6. A method for respectively dry-etching first and second substrates made of silicon, comprising:

etching the first substrate within an etching chamber;

taking the first substrate out of the etching chamber;

disposing a dummy substrate having a surface portion within the etching chamber, the surface portion being made of a material different than silicon;

etching a reaction product produced while etching the first substrate;

taking the dummy substrate out of the etching chamber;

disposing the second substrate within the etching chamber; and etching the second substrate, wherein said etching of the reaction product includes a cleaning step of etching the reaction product, and a seasoning step of removing the reaction product from the etching chamber and adjusting an atmosphere within the etching chamber and a temperature of the dummy substrate, and wherein the cleaning step uses a gas having an etching speed with respect to the dummy substrate smaller than that with respect to the first and second substrates.

7. A method for respectively dry-etching first and second substrates made of silicon, comprising:

etching the first substrate within an etching chamber;

taking the first substrate out of the etching chamber;

disposing a dummy substrate having a surface portion within the etching chamber, the surface portion being made of a material different than silicon;

etching a reaction product while etching the first substrate;

taking the dummy substrate out of the etching chamber;

disposing the second substrate within the etching chamber; and etching the second substrate, wherein said etching of the reaction product includes a cleaning step of etching the reaction product, and a seasoning step of removing the reaction product from the etching chamber and adjusting an atmosphere within the etching chamber and a temperature of the dummy substrate, and wherein the cleaning step includes a first cleaning step performed at a first pressure and a second cleaning step performed at a second pressure different from the first pressure.

8. A method for etching a silicon substrate, comprising:

etching the substrate with an etching gas within an etching chamber, the substrate being fixed to an electrode by a clamp;

a purge step of removing foreign materials that are suspended within the etching chamber and attached to the substrate, the electrode, a wall of the etching chamber, and the clamp, the purge step being performed while flowing a purge gas in a non-plasma state; and further etching the substrate with the etching gas, wherein the purge gas has a composition substantially the same as that of the etching gas.

9. The method of claim 8, wherein:

a flow rate of purge gas is substantially the same as that of the etching gas, and the purge step is performed in the non-plasma state, while said etching and said further etching are performed to generate plasma within the etching chamber.

10. A method for etching a silicon substrate, comprising:

etching the substrate with an etching gas within an etching chamber, the substrate being fixed to an electrode by a clamp;

a purge step of removing foreign materials that are suspended within the etching chamber and attached to the substrate, the electrode, a wall of the etching chamber, and the clamp, the purge step being performed while flowing a purge gas in a non-plasma state; and further etching the substrate with the etching gas, wherein the substrate has an etching mask formed on a surface thereof, the etching mask being made of $SiO_2$ and having an opening at a specific portion, and wherein the purge step is performed under conditions such that an etching speed ratio of the substrate with respect to the etching mask is small compared to that in the first and second etching steps if plasma is generated in the purge step, and such that a flow rate of the purge gas is larger than that of the etching gas in the first and second etching steps.

11. A method of dry-etching first and second substrates made of silicon, comprising:

etching the first substrate within an etching chamber;

removing the first substrate from the etching chamber;

disposing a dummy substrate within the etching chamber;

performing a cleaning step for etching a reaction product to thereby produce foreign materials, the reaction product being produced when the first substrate is etched;

performing a purge step for removing the foreign materials from the etching chamber without generating plasma, the purge step being performed with a gas having a composition that is substantially the same as that used for etching the first substrate;

removing the dummy substrate from the etching chamber;

disposing the second substrate within the etching chamber; and etching the second substrate.

12. The method of claim 11, further comprising performing a seasoning step for removing the reaction product from the etching chamber and adjusting an atmosphere within the etching chamber and a temperature of the dummy substrate, said seasoning step being performed before the purge step.

13. The method of claim 12, wherein the seasoning step is performed with a gas mixture that minimizes formation of a reaction product containing silicon and oxygen on the first and second substrates.

14. The method of claim 12, wherein the seasoning step is performed with a gas mixture not containing both of $SiF_4$ and $O_2$ gases together.

15. The method of claim 12, wherein:

HBr, $SiF_4$, and $O_2$ gases are used in the steps of etching the first and second substrates and in the seasoning step; and a total flow rate of the HBr, $SiF_4$, and $O_2$ which is introduced into the etching chamber in the seasoning step is smaller than that in the etching steps.

16. The method of claim 15, wherein a flow rate of the $SiF_4$ gas in the seasoning step is substantially zero.

17. The method of claim 11, wherein in the step of etching the first substrate, the first substrate is fixed to an electrode by a clamp within the etching chamber.

18. The method of claim 11, wherein:

gas conditions in the purge step are substantially the same as those in the steps of etching the first and second substrates, and the purge step is performed without generating plasma, while the steps of etching the first and second substrates are performed to generate plasma within the etching chamber.

19. The method of claim 11, wherein:

the dummy substrate has an $SiO_2$ layer on a surface thereof; and the purge step is performed under conditions such that an etching speed ratio of the first and second substrates with respect to the $SiO_2$ layer is small compared to that in the steps of etching the first and second substrates if plasma is generated in the purge step, and such that a flow rate of a gas used in the purge step is larger than that in the steps of etching the first and second substrates.

20. The method of claim 11, further including a step of stabilizing a pressure within the etching chamber before performing the step of etching the second substrate.

21. The method of claim 20, further including a step of stabilizing a flow rate of a gas that is introduced into the etching chamber before performing the step of etching the second substrate.

22. The method of claim 11, wherein the cleaning step is performed with a gas having an etching speed with respect to the dummy substrate smaller than that with respect to the first and second substrates.

23. The method of claim 11, wherein the cleaning step includes a first cleaning step performed at a first pressure and a second cleaning step performed at a second pressure different from the first pressure.

24. The method of claim 11, wherein the cleaning step uses a gas containing one of $SF_6$ and $NF_3$ gases.

25. The method of claim 11, wherein the reaction product contains silicon and oxygen.

26. The method of claim 11, wherein the dummy substrate has an $SiO_2$ layer on a surface thereof.

27. The method of claim 11, wherein the first substrate is the same as the second substrate, and is etched before and after the step of etching the reaction product.

28. A method of dry-etching first and second substrates made of silicon, said method comprising:

etching the first substrate within an etching chamber with an etching gas;

removing the first substrate from the etching chamber;

disposing a dummy substrate within the etching chamber;

performing a cleaning step for etching a reaction product with a cleaning gas, the reaction product being produced when the first substrate is etched;

removing the dummy substrate from the etching chamber;

disposing the second substrate within the etching chamber; and etching the second substrate, wherein the etching gas has a composition capable of producing silicon dioxide as the reaction product in an amount which is larger than that produced by the cleaning gas.

29. The method of claim 28, further comprising a seasoning step for removing the reaction product from the etching chamber and adjusting an atmosphere within the etching chamber and a temperature of the dummy substrate.

30. The method of claim 29, wherein the seasoning step is performed with a gas mixture that minimizes formation of a reaction product containing silicon and oxygen on the first and second substrates.

31. The method of claim 29, wherein the seasoning step is performed with a mixture gas not containing both of $SiF_4$ and $O_2$ gases together.

32. The method of claim 29, wherein:

HBr, $SiF_4$, and $O_2$ gases are used in the steps of etching the first and second substrates and in the seasoning step; and a total flow rate of the HBr, $SiF_4$, and $O_2$ which is introduced into the etching chamber in the seasoning step is smaller than that in the etching steps.

33. The method of claim 32, wherein a flow rate of the $SiF_4$ gas in the seasoning step is substantially zero.

34. The method of claim 29, wherein the seasoning step is performed while generating plasma within the etching chamber.

35. The method of claim 29, further comprising a purge step for removing foreign materials remaining within the etching chamber after the seasoning step, the purge step being performed without generating plasma.

36. The method of claim 35,
gas conditions in the purge step are substantially the same as those in the steps of etching the first and second substrates, and
the purge step is performed without generating plasma, while the steps of etching the first and second substrates are performed to generate plasma within the etching chamber.

37. The method of claim 35, wherein:
the dummy substrate has an $SiO_2$ layer on a surface thereof; and
the purge step is performed under conditions such that an etching speed ratio of the first and second substrates with respect to the $SiO_2$ layer is small compared to that in the steps of etching the first and second substrates if plasma is generated in the purge step, and such that a flow rate of a gas used in the purge step is larger than that in the steps of etching the first and second substrates.

38. The method of claim 28, further including a step of stabilizing a pressure within the etching chamber before performing the step of etching the second substrate.

39. The method of claim 38, further including a step of stabilizing a flow rate of a gas that is introduced into the etching chamber before performing the step of etching the second substrate.

40. The method of claim 28, wherein the cleaning step is performed with a gas having an etching speed with respect to the dummy substrate smaller than that with respect to the first and second substrates.

41. The method of claim 28, wherein the cleaning step includes a first cleaning step performed at a first pressure and a second cleaning step performed at a second pressure different from the first pressure.

42. The method of claim 28, wherein the cleaning step uses a gas containing one of $SF_6$ and $NF_3$ gases.

43. The method of claim 28, wherein the dummy substrate has an $SiO_2$ layer on a surface thereof.

44. The method of claim 28, wherein the first substrate is the same as the second substrate, and is etched before and after the step of etching the reaction product.

* * * * *